US009018998B2

(12) United States Patent
Sun et al.

(10) Patent No.: US 9,018,998 B2
(45) Date of Patent: Apr. 28, 2015

(54) DELAY TIME ADJUSTING CIRCUIT, METHOD, AND INTEGRATED CIRCUIT

(71) Applicant: Fairchild Semiconductor Corporation, San Jose, CA (US)

(72) Inventors: Weiming Sun, Beijing (CN); Ming Chuen Alvan Lam, Scarborough, ME (US); Lei Huang, Beijing (CN); Emma Wang, Beijing (CN); Peng Zhu, Tianjin (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/103,078

(22) Filed: Dec. 11, 2013

(65) Prior Publication Data

US 2014/0167830 A1    Jun. 19, 2014

(51) Int. Cl.
*H03H 11/26*    (2006.01)
*H03K 5/13*    (2014.01)

(52) U.S. Cl.
CPC ..................................... *H03K 5/131* (2013.01)

(58) Field of Classification Search
USPC ......... 327/261, 269, 270, 272, 274, 276, 278, 327/280, 281, 283, 285, 287, 288
See application file for complete search history.

(56) References Cited

U.S. PATENT DOCUMENTS

| 5,942,937 | A | * | 8/1999 | Bell | 329/303 |
| 5,963,071 | A | * | 10/1999 | Dowlatabadi | 327/175 |
| 6,121,812 | A | * | 9/2000 | Tsukikawa | 327/280 |
| 6,229,364 | B1 | * | 5/2001 | Dortu et al. | 327/158 |
| 6,492,922 | B1 | * | 12/2002 | New | 341/120 |
| 7,132,868 | B2 | * | 11/2006 | Sakata et al. | 327/170 |
| 8,374,571 | B2 | * | 2/2013 | Motozawa et al. | 455/333 |
| 2010/0134083 | A1 | * | 6/2010 | Trescases | 323/283 |

* cited by examiner

*Primary Examiner* — William Hernandez

(74) *Attorney, Agent, or Firm* — Schwegman Lundberg & Woessner, P.A.

(57) ABSTRACT

A delay time adjusting circuit is described, in which a reference signal circuit generates at least one reference signal to an A/D conversion circuit, an input signal circuit generates an input signal to the A/D conversion circuit, the A/D conversion circuit compares the input signal with the at least one reference signal to output a digital signal to a digital logic chip, and the digital logic chip determines a delay time based on the digital signal. In this way, the delay time can be determined digitally, and an adjusting accuracy of the delay time can be increased; and also, the delay time can be adjusted through changing the level of the input signal, thus reducing circuit losses and costs.

20 Claims, 4 Drawing Sheets

DELAY TIME ADJUSTING CIRCUIT, METHOD, AND INTEGRATED CIRCUIT

CLAIM OF PRIORITY

This application claims the benefit of priority of Chinese Patent Application Serial No. 201210562265.1, filed on Dec. 17, 2012, which is incorporated by reference herein in its entirety.

TECHNICAL FIELD

Among others, the disclosure relates generally to delay techniques, and in particular to a delay time adjusting circuit, method, and integrated circuit.

BACKGROUND

Currently, a delay circuit generally provides a delay time depending on a charging time of a capacitor in the delay circuit. In order to adjust the delay time of the delay circuit, parameters of resistor-capacitor (RC) components in the delay circuit have to be adjusted, such that the charging time of the capacitor can be adjusted. As the charging time of the capacitor depends on a capacitance of the capacitor and a charging current, a capacitor with a large capacitance is needed when the charging current is small. In this case, circuit losses and costs are increased, which is unfavorable for circuit design.

Additionally, the capacitance of the capacitor and the charging current may deviate from their respective expected values because of being susceptible to an external circuit, which results in that the delay time of the delay circuit has a low accuracy.

OVERVIEW

In view of the above, the disclosure provides, among others, a delay time adjusting circuit, method, and integrated circuit.

In an example, a delay time adjusting circuit is provided, which includes a reference signal circuit, an input signal circuit, an analog-to-digital (A/D) conversion circuit and a digital logic chip. The reference signal circuit is configured to generate at least one reference signal to the A/D conversion circuit. The input signal circuit is configured to generate an input signal to the A/D conversion circuit. The A/D conversion circuit is configured to compare a level of the input signal with that of the at least one reference signal, and to output a digital signal to the digital logic chip. The digital logic chip is configured to determine a delay time based on the digital signal.

In another example, a delay time adjusting method is provided, in which a level of an input signal is determined based on a desired delay time, the input signal and at least one reference signal are communicated to an A/D conversion circuit, which compares the input signal with the at least one reference signal to output a digital signal, and a delay time is determined based on the digital signal.

In yet another example, an integrated circuit is provided, which includes a delay time adjusting circuit, a delay circuit and an action circuit. The delay time adjusting circuit is configured to compare a level of an input signal with that of at least one reference signal to result in a digital signal, to determine a delay time based on the digital signal, and to provide the delay time to the delay circuit when the delay circuit is triggered. The delay circuit is configured to generate a delay with the delay time provided by the delay time adjusting circuit when being triggered and to output an indication signal to the action circuit when the delay time expires. The action circuit is configured to receive the indication signal and to perform an action in response to the indication signal.

According to the present disclosure, the reference signal circuit in the delay time adjusting circuit generates at least one reference signal to the A/D conversion circuit, the input signal circuit generates the input signal to the A/D conversion circuit, the A/D conversion circuit compares the input signal with the at least one reference signal to output the digital signal to the digital logic chip, and the digital logic chip determines the delay time based on the digital signal. In this way, the delay time can be determined digitally, and the adjusting accuracy of the delay time can be increased. Also, the delay time can be adjusted through changing the level of the input signal, thus reducing circuit losses and costs.

This overview is intended to provide an overview of subject matter of the present patent application. It is not intended to provide an exclusive or exhaustive explanation of the invention. The detailed description is included to provide further information about the present patent application.

DETAILED DESCRIPTION

Figure 1:
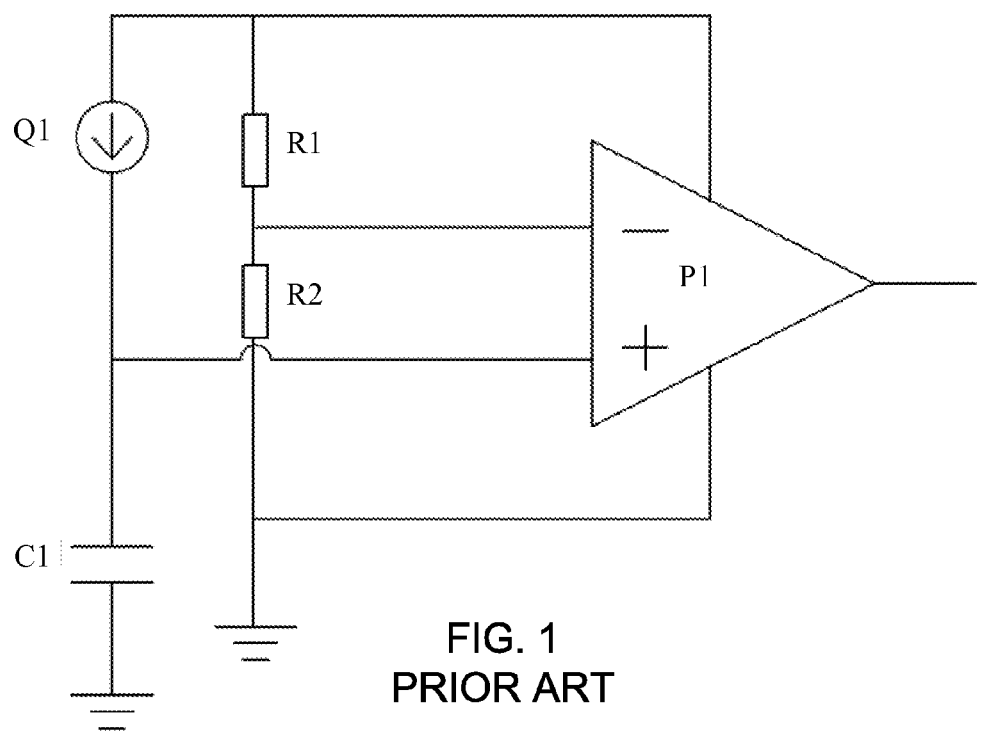
FIG. 1 illustrates a schematic view of a delay circuit in the prior art.

As shown in FIG. 1, an example delay circuit includes a current source Q1, a capacitor C1, a first resistor R1, a second resistor R2, and a comparator P1. The capacitor C1 is charged by the source Q1. The first and second resistors R1 and R2 are used to divide a supply voltage. A voltage across the second resistor R2 is coupled to a negative terminal of the comparator P1. When a voltage across the capacitor C1 becomes greater than the voltage across the second resistor R2, an output of the comparator P1 turns from a negative signal to a positive signal. A time period during which the voltage across the capacitor C1 increases from zero to be greater than the voltage across the second resistor R2 is the delay time provided by the delay circuit.

Here, when the charging current provided by the current source Q1 is less than or equal to 100 nA, a capacitor C1 with a larger capacitance is needed in order to provide a same delay time. In this case, circuit losses and costs are increased, which is unfavorable for circuit design. Additionally, as the capacitance of the capacitor C1 and the charging current may deviate from their respective expected values, it is unfavorable to adjust the delay time of the delay circuit.

According to various embodiments of the disclosure, a reference signal circuit in the delay time adjusting circuit generates at least one reference signal to an A/D conversion circuit, an input signal circuit generates an input signal to the A/D conversion circuit, the A/D conversion circuit compares a level of the input signal with the level of the at least one reference signal to output a digital signal to a digital logic chip, which determines the delay time based on the digital signal.

The disclosure will be described in detail with reference to the drawings and the specific embodiments.

Figure 2:
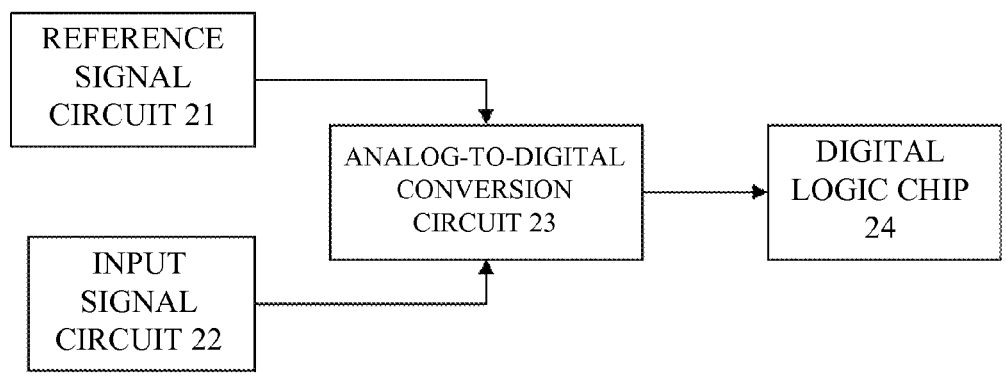
FIG. 2 illustrates a schematic view of a delay time adjusting circuit according to an embodiment of the disclosure.

According to an embodiment of the disclosure, a delay time adjusting circuit is provided. As shown in FIG. 2, the delay time adjusting circuit includes a reference signal circuit 21, an input signal circuit 22, an A/D conversion circuit 23 and a digital logic chip 24.

The reference signal circuit 21 is configured to generate at least one reference signal to the A/D conversion circuit 23.

The input signal circuit 22 is configured to generate an input signal to the A/D conversion circuit 23.

The input signal may have a level determined by the desired delay time.

The A/D conversion circuit 23 is configured to compare the level of the input signal with the level of the at least one reference signal, and to output a digital signal to the digital logic chip 24.

The digital logic chip 24 is configured to determine the delay time based on the digital signal.

Figure 3:
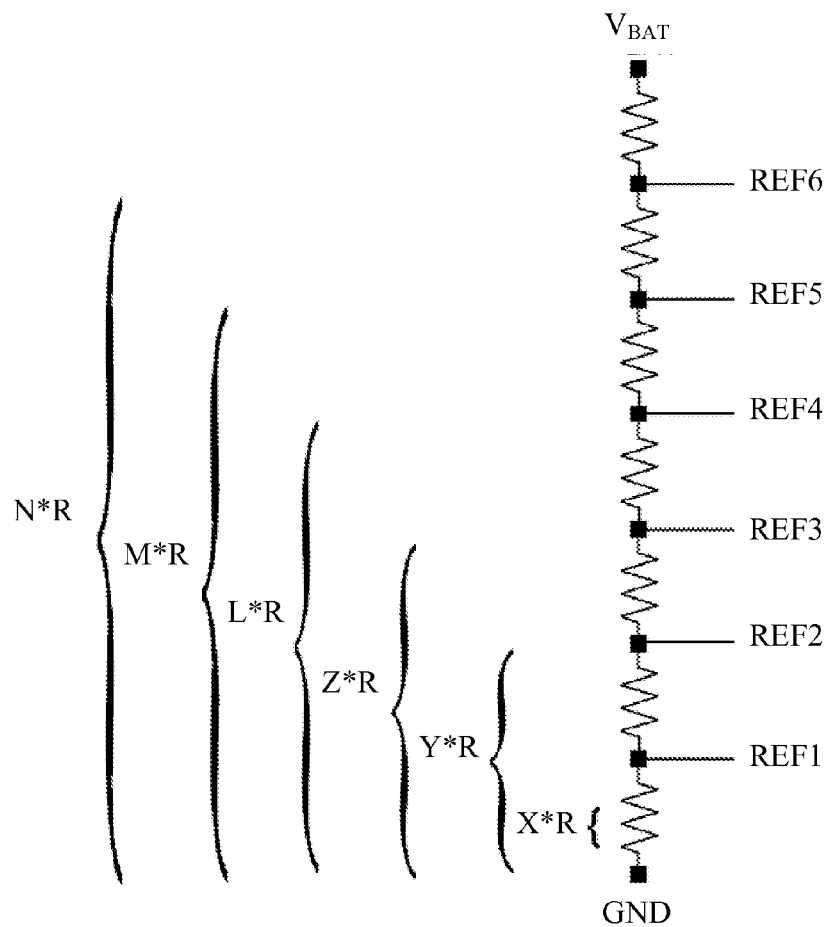
FIG. 3 illustrates a schematic view of a reference signal circuit according to an embodiment of the disclosure.
Figure 4:
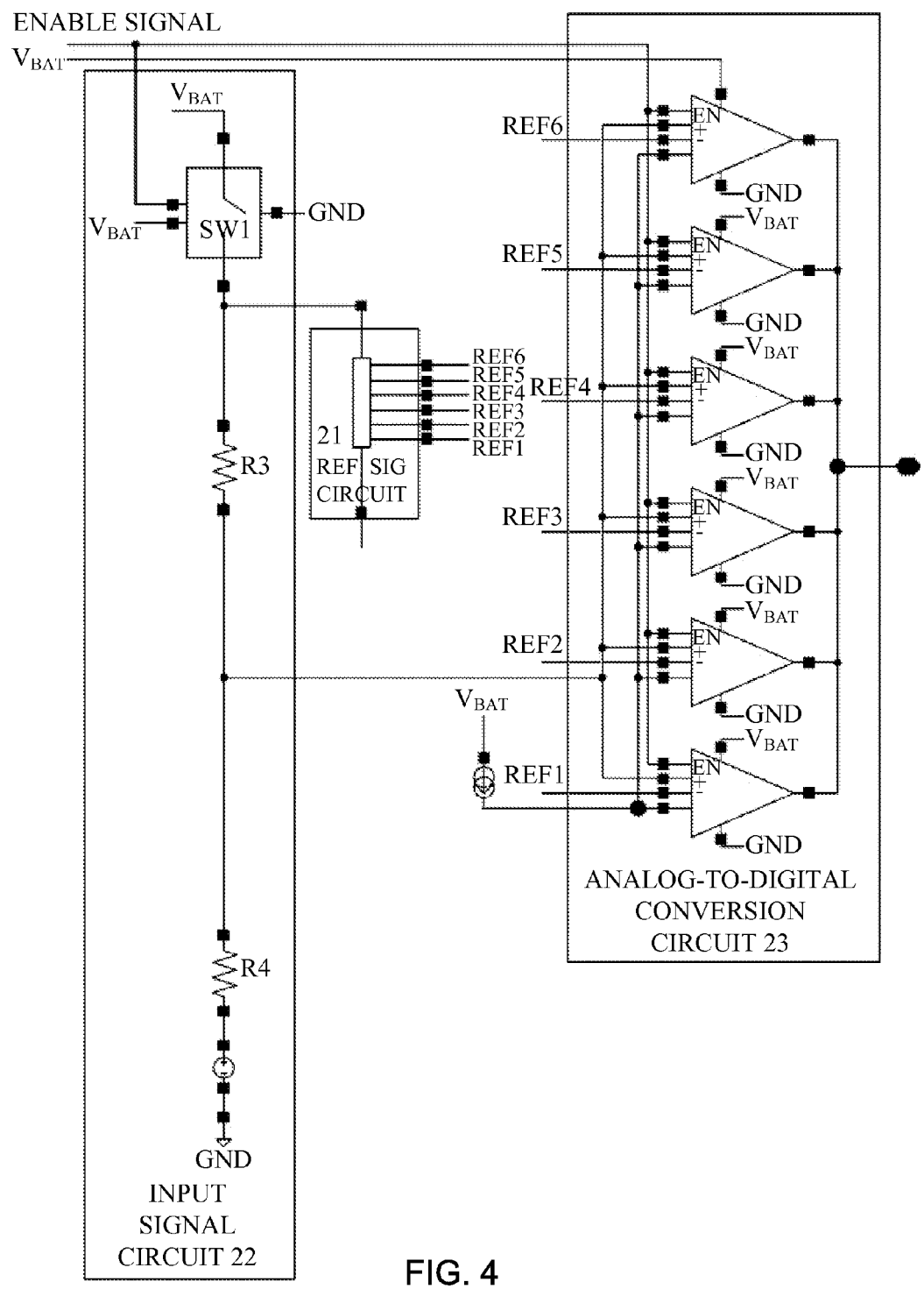
FIG. 4 is a schematic view illustrating connections of a reference signal circuit, an input signal circuit and an A/D conversion circuit according to an embodiment of the disclosure.

Specifically, the reference signal circuit 21 may be configured to divide the supply voltage through more than one resistors serially coupled to one another, so as to generate at least one reference signal. As shown in FIGS. 3 and 4, in the reference signal circuit 21, the power supply has a battery voltage $V_{BAT}$, 100 resistors with equal resistance values are serially coupled to one another to provide a voltage-dividing accuracy of 1%, and six reference signals are generated. A first reference signal Ref1 is generated at a node which has a distance of X resistors from a ground (GND) terminal, a second reference signal Ref2 is generated at a node which has a distance of Y resistors from the GND terminal, a third reference signal Ref3 is generated at a node which has a distance of Z resistors from the GND terminal, a fourth reference signal Ref4 is generated at a node which has a distance of L resistors from the GND terminal, a fifth reference signal Ref5 is generated at a node which has a distance of M resistors from the GND terminal, a six reference signal Ref6 is generated at a node which has a distance of N resistors from the GND terminal, where $X<Y<Z<L<M<N$, $N \le 100$. It should be noted that the above technical scheme in which six reference signals are generated is just an example. One of ordinary skill in the art may contemplate generating other number of reference signals, for example, five or seven reference signals, which can be implemented in a similar way as the above example.

As shown in FIG. 4, the input signal circuit 22 may include a switch circuit SW1, an internal resistor R3 and an external resistor R4, which are coupled serially to each other.

The switch circuit SW1 may be configured to close a switch to couple the supply voltage to a serial path of the internal resistor R3 and the external resistor R4, upon reception of an enable signal at a receiving terminal OE.

Here, the power supply has a battery voltage $V_{BAT}$.

The external resistor R4 may be configured to divide the supply voltage and to generate an input signal to the A/D conversion circuit. A larger resistance value of the external resistor R4 may cause the input signal of a higher level.

Accordingly, the resistance value of the external resistor R4 may be adjusted based on the desired delay time, such that the level of the input signal may be adjusted.

Figure 5:
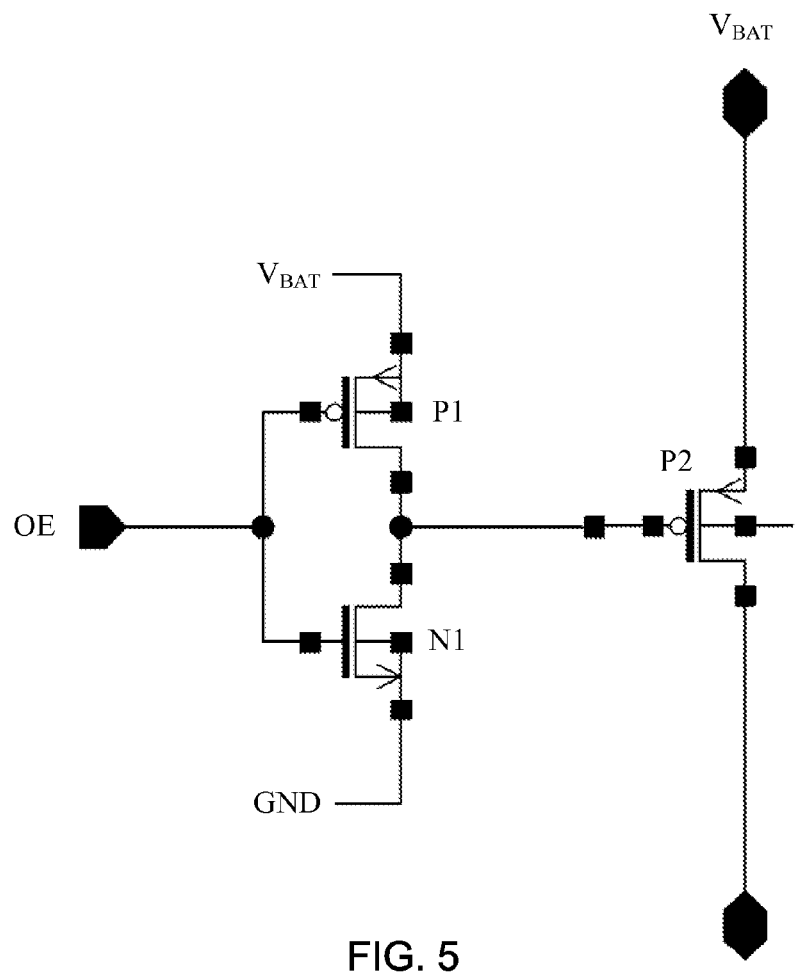
FIG. 5 illustrates a schematic view of a switch circuit according to an embodiment of the disclosure.

As shown in FIG. 5, the switch circuit SW1 may include a first P-channel metal oxide semiconductor (PMOS) P1, a first N-channel metal oxide semiconductor (NMOS) N1, and a second PMOS P2. The first PMOS P1 has a source coupled to the supply voltage, a gate coupled to the reception terminal OE, and a drain coupled to a drain of the first NMOS N1. The first NMOS N1 has a source coupled to the ground, a gate coupled to the reception terminal OE, and the drain coupled to a drain of the first PMOS P1. The second PMOS P2 has a gate coupled to both the drains of the first PMOS P1 and the first NMOS N1, a source coupled to the supply voltage and a drain, as an output, coupled to the internal resistor R3. When an enable (high level) signal is received at the reception terminal OE, the first PMOS P1 is turned off, the first NMOS N1 is turned on, a gate voltage of the second PMOS P2 is pulled low, the second PMOS P2 is turned on and the supply voltage is input to the internal resistor R3.

The A/D conversion circuit 23 includes at least one comparator, each coupled to a reference signal. The comparators are arranged in a descending order of the levels of the respective reference signals to which the comparators are coupled respectively. Additionally, each of the comparators is coupled to a same input signal and compares the level of the respective reference signal with the level of the input signal. When the level of the input signal is greater than the level of the reference signal to which the comparator is coupled, the comparator outputs a high level signal, i.e., a digital signal 1. When the level of the input signal is not greater than the level of the reference signal to which the comparator is coupled, the comparator outputs a low level signal, i.e., digital signal 0. The digital signals output by the comparators are transferred to the digital logic chip 24.

As shown in FIG. 4, in the case that there are six reference signals, the A/D conversion circuit 23 includes six comparators, to which the six reference signals are input respectively. Each of the comparators at three most significant bits (MSB) has an NMOS as an input MOS, and each of the comparators at three lowest significant bits (LSB) has a PMOS as an input MOS. Each of the comparators receives the input signal and compares the level of the input signal with the level of the reference signal to which the comparator is coupled. When the level of the input signal is greater than the level of the reference signal to which the comparator is coupled, the comparator outputs a high level signal, i.e., a digital signal 1. When the level of the input signal is not greater than the level of the reference signal to which the comparator is coupled, the comparator outputs a low level signal, i.e., a digital signal 0. Here, the levels of the references signals input to the comparators at the three MSBs are higher than those of the references signals input to the comparators at the three LSBs.

The digital logic chip 24 may be specifically configured to determine a delay ratio based on the digital signal and to multiply the determined delay ratio by a reference time to result in the delay time.

The digital logic chip 24 may determine the delay ratio based on the digital signal in the following way: a correspondence table between digital signals and the respective delay ratios may be pre-stored in the digital logic chip 24, and the digital logic chip 24 finds out from the correspondence table a delay ratio corresponding to the digital signal output from the A/D conversion circuit 23.

Table 1 presents correspondences between R3-R4 and the digital signals output by the A/D conversion circuit 23, the values of delay time, the delay ratios, where GND denotes an instance in which a common terminal of the internal resistor R3 and the external resistor R4 is coupled to the ground, i.e., the input signal has a level of a GND voltage; $V_{BAT}$ denotes an instance in which the common terminal of the internal resistor R3 and the external resistor R4 is coupled to the battery voltage $V_{BAT}$, i.e., the input signal has a level of a supply voltage. As can be seen, in the instance that the common terminal of the internal resistor R3 and the external resistor R4 is coupled to the battery voltage $V_{BAT}$, all the six comparators in the A/D conversion circuit output a digital signal "1", the delay time is 7.5 seconds, the delay ratio is 1, and the reference time is 7.5 seconds. A user may adjust the resistance value of the external resistor R4 by referring to table 1, according to the desired delay time.

TABLE 1

| resistance of internal resistor | resistance of external resistor | digital signal | delay time (s) | delay ratio |
|---|---|---|---|---|
| 22000 | Tie to GND | 2b'00_0000 | 3.8 | 0.5 |
| 22000 | 3900 | 2b'00_0001 | 5.6 | 0.75 |
| 22000 | 10000 | 2b'00_0011 | 9.4 | 1.25 |
| 22000 | 22000 | 2b'00_0111 | 11.3 | 1.5 |
| 22000 | 47000 | 2b'00_1111 | 13.1 | 1.75 |
| 22000 | 120000 | 2b'01_1111 | 15 | 2 |
| 22000 | Tie to VBAT | 2b'11_1111 | 7.5 | 1 |

Based on the delay time adjusting circuit described above, in an embodiment, a delay time adjusting method is provided, in which a level of an input signal is determined based on a desired delay time, the input signal and at least one reference signal are communicated to an A/D conversion circuit, which compares the input signal with the at least one reference signal to output a digital signal, and a delay time is determined based on the digital signal.

Here, the at least one reference signal may be acquired by dividing a supply voltage through more than one resistors coupled serially to one another.

Here, the input signal may be acquired by dividing a supply voltage through an external resistor, or the input signal has a level of a ground voltage or of the supply voltage.

Here, the A/D conversion circuit may include at least one comparator, each coupled to a respective one of the at least one reference signal and a same input signal, and the comparators are arranged in a descending order of levels of the reference signals to which they are coupled respectively, and each of the comparators compares a level of the input signal with the level of the reference signal to which the comparator is coupled, outputs a digital signal "1" when the level of the input signal is greater than the level of the reference signal, and outputs a digital signal "0" when the level of the input signal is not greater than the level of the reference signal.

In an embodiment, when determining the delay time based on the digital signal, a delay ratio is determined based on the digital signal first, and then the determined delay ratio is multiplied by a reference time to result in the delay time.

Generally, a correspondence table between each digital signal and the respective delay ratio may be preset, and a delay ratio corresponding to the digital signal output from the A/D conversion circuit 23 is found out from the correspondence table.

Figure 6:
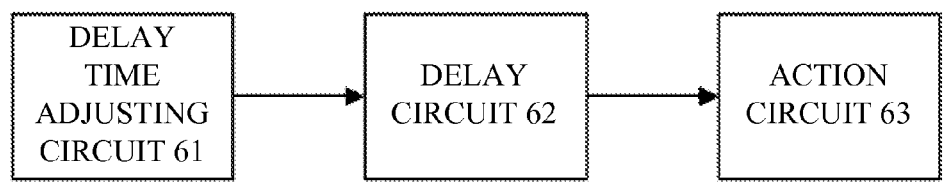
FIG. 6 illustrates a block diagram of an integrated circuit according to an embodiment of the disclosure.

Based on the delay time adjusting circuit as described above, an integrated circuit is provided, as shown in FIG. 6. The integrated circuit includes a delay time adjusting circuit 61, a delay circuit 62, and an action circuit 63.

The delay time adjusting circuit 61 is configured to compare a level of an input signal with a level of at least one reference signal to result in a digital signal, to determine a delay time based on the digital signal, and to provide the delay time to the delay circuit 62 when the delay circuit 62 is triggered.

The delay circuit 62 is configured to generate a delay with the delay time provided by the delay time adjusting circuit 61 when being triggered and to output an indication signal to the action circuit 63 when the delay time expires.

The action circuit 63 is configured to receive the indication signal and to perform an action in response to the indication signal.

A shown in FIG. 2, the delay time adjusting circuit 61 includes a reference signal circuit 21, an input signal circuit 22, an A/D conversion circuit 23 and a digital logic chip 24.

The reference signal circuit 21 is configured to generate at least one reference signal to the A/D conversion circuit 23.

The input signal circuit 22 is configured to generate an input signal to the A/D conversion circuit 23.

The input signal may have a level determined by the desired delay time.

The A/D conversion circuit 23 is configured to compare the level of the input signal with the level of the at least one reference signal, to output a digital signal to the digital logic chip 24.

The digital logic chip 24 is configured to determine the delay time based on the digital signal and to provide the delay time to the delay circuit 62 when the delay circuit 62 is triggered.

Specifically, the reference signal circuit 21 may be configured to divide the supply voltage through more than one resistors serially coupled to one another, to generate at least one reference signal. As shown in FIGS. 3 and 4, in the reference signal circuit 21, the power supply has a battery voltage $V_{BAT}$, 100 resistors with equal resistance values are serially coupled to one another to provide a voltage-dividing accuracy of 1%, and six reference signals are generated. A first reference signal Ref1 is generated at a node which has a distance of X resistors from a ground (GND) terminal, a second reference signal Ref2 is generated at a node which has a distance of Y resistors from the GND terminal, a third reference signal Ref3 is generated at a node which has a distance of Z resistors from the GND terminal, a fourth reference signal Ref4 is generated at a node which has a distance of L resistors from the GND terminal, a fifth reference signal Ref5 is generated at a node which has a distance of M resistors from the GND terminal, a six reference signal Ref6 is generated at a node which has a distance of N resistors from the GND terminal, where $X<Y<Z<L<M<N$, $N\leq100$. It should be noted that the above technical scheme in which six reference signals are generated is just an example. One of ordinary skill in the art may contemplate generating other number of reference signals, for example, five or seven reference signals, which can be implemented in a similar way as the above example.

As shown in FIG. 4, the input signal circuit 22 may include a switch circuit SW1, an internal resistor R3 and an external resistor R4. The switch circuit SW1, the internal resistor R3 and the external resistor R4 are coupled serially to each other.

The switch circuit SW1 may be configured to close a switch to couple the supply voltage to a serial path of the internal resistor R3 and the external resistor R4, upon reception of an enable signal at a receiving terminal OE.

Here, the power supply has a battery voltage $V_{BAT}$.

The external resistor R4 may be configured to divide the supply voltage and to generate an input signal to the A/D conversion circuit. A larger resistance value of the external resistor R4 may cause the input signal of a higher level.

Accordingly, the resistance value of the external resistor R4 may be adjusted based on the desired delay time, such that the level of the input signal may be adjusted.

As shown in FIG. 5, the switch circuit SW1 may include a first P-channel metal oxide semiconductor (PMOS) P1, a first N-channel metal oxide semiconductor (NMOS) N1, and a second PMOS P2. The first PMOS P1 has a source coupled to the supply voltage, a gate coupled to the reception terminal OE, and a drain coupled to a drain of the first NMOS N1. The first NMOS N1 has a source coupled to the ground, a gate coupled to the reception terminal OE, and the drain coupled to a drain of the first PMOS P1. The second PMOS P2 has a gate coupled to both the drains of the first PMOS P1 and the first NMOS N1, a source coupled to the supply voltage and a drain, as an output, coupled to the internal resistor R3. When an enable (high level) signal is received at the reception terminal OE, the first PMOS P1 is turned off, the first NMOS N1 is turned on, a gate voltage of the second PMOS P2 is pulled low, the second PMOS P2 is turned on and the supply voltage is input to the internal resistor R3.

The A/D conversion circuit 23 includes at least one comparator, each coupled to a respective reference signal. The comparators are arranged in a descending order of the levels of the respective reference signals to which the comparators are coupled respectively. Additionally, each of the comparators is coupled to a same input signal and compares the level of the respective reference signal with the level of the input signal. When the level of the input signal is greater than the level of the reference signal to which the comparator is coupled, the comparator outputs a high level signal, i.e., a digital signal 1. When the level of the input signal is not greater than the level of the reference signal to which the comparator is coupled, the comparator outputs a low level signal, i.e., digital signal 0. The digital signals output by the comparators are transferred to the digital logic chip 24.

As shown in FIG. 4, in the case that there are six reference signals, the A/D conversion circuit 23 includes six comparators, to which the six reference signals are input respectively. Each of the comparators at three most significant bits (MSB) has an NMOS as an input MOS, and each of the comparators at three lowest significant bits (LSB) has a PMOS as an input MOS. Each of the comparators receives the input signal and compares the level of the input signal with the level of the reference signal to which the comparator is coupled, outputs a digital signal "1" when the level of the input signal is greater than the level of the reference signal, and outputs a digital signal "0" when the level of the input signal is not greater than the level of the reference signal. Here, the levels of the references signals input to the comparators at the three MSBs are higher than those of the references signals input to the comparators at the three LSBs.

Specifically, the digital logic chip 24 may be configured to determine a delay ratio based on the digital signal and to multiply the determined delay ratio by a reference time to result in the delay time.

The digital logic chip 24 may determine the delay ratio based on the digital signal in the following way: a correspondence table between digital signals and the respective delay ratios may be pre-stored in the digital logic chip 24, and the digital logic chip 24 finds out from the correspondence table a delay ratio corresponding to the digital signal output from the A/D conversion circuit 23.

The action circuit 63 may be a reset circuit, a power-off circuit and other circuits performing specific functions.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configured an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A delay time adjusting circuit, comprising:
a reference signal circuit configured to generate at least one reference signal;
an input signal circuit configured to generate an input signal;
an analog-to-digital (A/D) conversion circuit configured to compare a level of the input signal with that of the at least one reference signal and to output a digital signal; and
a digital logic chip configured to determine a delay time based on the digital signal, to determine a delay ratio based on the digital signal, and to multiply the determined delay ratio by a reference time to result in the delay time.

2. The delay time adjusting circuit according to claim 1, wherein the reference signal circuit is configured to divide a supply voltage through more than one resistors serially coupled to one another, so as to generate the at least one reference signal.

3. The delay time adjusting circuit according to claim 1, wherein the input signal circuit comprises a switch circuit, an internal resistor and an external resistor, which are coupled serially to each other,
wherein the switch circuit is configured to close a switch, upon reception of an enable signal, so as to couple a supply voltage to a serial path of the internal resistor and the external resistor, and
wherein the external resistor is configured to generate an input signal to the A/D conversion circuit after dividing the supply voltage, wherein the input signal has a level determined by a desired delay time.

4. The delay time adjusting circuit according to claim 3, wherein the switch circuit comprises a first P-channel Metal Oxide Semiconductor Field Effect Transistor (PMOS), a first N-channel Metal Oxide Semiconductor Field Effect Transistor (NMOS), and a second PMOS,
wherein the first PMOS has a source coupled to the supply voltage, a gate coupled to a reception terminal, and a drain coupled to a drain of the first NMOS,
wherein the first NMOS has a source coupled to ground, a gate coupled to the reception terminal, and the drain coupled to a drain of the first PMOS, and
wherein the second PMOS has a gate coupled to both the drains of the first PMOS and the first NMOS, a source coupled to the supply voltage and a drain as an output.

5. The delay time adjusting circuit according to claim 1, wherein the A/D conversion circuit comprises at least one comparator, each coupled to a respective one of the at least one reference signal and a same input signal, and the comparators are arranged in a descending order of levels of the reference signals to which they are coupled respectively.

6. The delay time adjusting circuit according to claim 5, wherein each of the comparators is configured to compare a level of the input signal with the level of the reference signal to which the comparator is coupled, to output a digital signal "1" when the level of the input signal is greater than the level of the reference signal, and to output a digital signal "0" when the level of the input signal is not greater than the level of the reference signal.

7. The delay time adjusting circuit according to claim 1, wherein the input signal has a level of a ground voltage or of a supply voltage.

8. A delay time adjusting method, comprising:
determining a level of an input signal based on a desired delay time;
communicating the input signal and at least one reference signal to an analog-to-digital (A/D) conversion circuit;
comparing, by the A/D conversion circuit, a level of the input signal with that of the at least one reference signal, to output a digital signal; and
determining a delay time based on the digital signal;
wherein the determining a delay time based on the digital signal comprises:
determining a delay ratio based on the digital signal; and
multiplying the determined delay ratio by a reference time to result in the delay time.

9. The delay time adjusting method according to claim 8, wherein the at least one reference signal is acquired by dividing a supply voltage through more than one resistors coupled serially to one another.

10. The delay time adjusting method according to claim 8, wherein the input signal is acquired by dividing a supply voltage through an external resistor, or the input signal has a level of a ground voltage or of the supply voltage.

11. The delay time adjusting method according to claim 8, wherein the A/D conversion circuit comprises at least one comparator, each coupled to a respective one of the at least one reference signal and a same input signal, and the comparators are arranged in a descending order of levels of the reference signals to which they are coupled respectively, and
wherein each of the comparators compares a level of the input signal with the level of the reference signal to which the comparator is coupled, outputs a digital signal "1" when the level of the input signal is greater than the level of the reference signal, and outputs a digital signal "0" when the level of the input signal is not greater than the level of the reference signal.

12. An integrated circuit, comprising:
a delay time adjusting circuit configured to compare a level of an input signal with that of at least one reference signal to result in a digital signal, to determine a delay time based on the digital signal, to determine a delay ratio based on the digital signal, and to multiply the determined delay ratio by a reference time to result in the delay time;
a delay circuit configured to generate a delay using the delay time when the delay circuit is triggered and to output an indication signal when the delay time expires; and
an action circuit configured to receive the indication signal and to perform an action in response to the indication signal.

13. The integrated circuit according to claim 12, wherein the delay time adjusting circuit comprises a reference signal circuit, an input signal circuit, an analog-to-digital (A/D) conversion circuit and a digital logic chip,
wherein the reference signal circuit is configured to generate at least one reference signal to the A/D conversion circuit,
wherein the input signal circuit is configured to generate an input signal to the A/D conversion circuit, wherein the A/D conversion circuit is configured to compare a level of the input signal with that of the at least one reference signal, and to output a digital signal to the digital logic chip, and wherein the digital logic chip is configured to determine the delay time based on the digital signal and to provide the delay time to the delay circuit when the delay circuit is triggered.

14. The integrated circuit according to claim 13, wherein the reference signal circuit is configured to divide a supply voltage through more than one resistors serially coupled to one another, so as to generate the at least one reference signal.

15. The integrated circuit according to claim 13, wherein the input signal circuit comprises a switch circuit, an internal resistor and an external resistor, which are coupled serially to each other, wherein the switch circuit is configured to close a switch, upon reception of an enable signal, so as to couple a supply voltage to a serial path of the internal resistor and the external resistor, and wherein the external resistor is configured to generate an input signal to the A/D conversion circuit after dividing the supply voltage, wherein the input signal has a level determined by a desired delay time.

16. The integrated circuit according to claim 15, wherein the switch circuit comprises a first P-channel Metal Oxide Semiconductor Field Effect Transistor (PMOS), a first N-channel Metal Oxide Semiconductor Field Effect Transistor (NMOS), and a second PMOS, wherein the first PMOS has a source coupled to the supply voltage, a gate coupled to a reception terminal, and a drain coupled to a drain of the first NMOS, wherein the first NMOS has a source coupled to ground, a gate coupled to the reception terminal, and the drain coupled to a drain of the first PMOS, and wherein the second PMOS has a gate coupled to both the drains of the first PMOS and the first NMOS, a source coupled to the supply voltage and a drain as an output.

17. The integrated circuit according to claim 13, wherein the A/D conversion circuit comprises at least one comparator, each coupled to a respective one of the at least one reference signal and a same input signal, and the comparators are arranged in a descending order of levels of the reference signals to which they are coupled respectively.

18. The integrated circuit according to claim 17, wherein each of the comparators is configured to compare a level of the input signal with the level of the reference signal to which the comparator is coupled, to output a digital signal "1" when the level of the input signal is greater than the level of the reference signal, and to output a digital signal "0" when the level of the input signal is not greater than the level of the reference signal.

19. The integrated circuit according to claim 13, wherein the digital logic chip is configured to determine a delay ratio based on the digital signal and to multiply the determined delay ratio by a reference time to result in the delay time.

20. The integrated circuit according to claim 13, wherein the input signal has a level of a ground voltage or of a supply voltage.

* * * * *